(12) United States Patent
Hada et al.

(10) Patent No.: US 7,771,911 B2
(45) Date of Patent: Aug. 10, 2010

(54) PROCESS FOR PRODUCING PHOTORESIST COMPOSITION, FILTER, COATER AND PHOTORESIST COMPOSITION

(75) Inventors: Hideo Hada, Kawasaki (JP); Takeshi Iwai, Kawasaki (JP); Masaaki Shimazaki, Kawasaki (JP); Masaaki Muroi, Kawasaki (JP); Kota Atsuchi, Kawasaki (JP); Hiroaki Tomida, Kawasaki (JP); Hirokazu Ozaki, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 88 days.

(21) Appl. No.: 10/536,047

(22) PCT Filed: Dec. 18, 2003

(86) PCT No.: PCT/JP03/16268

§ 371 (c)(1),
(2), (4) Date: May 20, 2005

(87) PCT Pub. No.: WO2004/057422

PCT Pub. Date: Jul. 8, 2004

(65) Prior Publication Data
US 2006/0014098 A1 Jan. 19, 2006

(30) Foreign Application Priority Data
Dec. 19, 2002 (JP) .............................. 2002-368931
Dec. 15, 2003 (JP) .............................. 2003-416583

(51) Int. Cl.
*G03C 1/00* (2006.01)
*C02F 1/44* (2006.01)

(52) U.S. Cl. ................... 430/270.1; 210/650; 210/651; 210/652; 210/653

(58) Field of Classification Search .............. 430/270.1; 210/650, 651, 652, 653
See application file for complete search history.

(56) References Cited

U.S. PATENT DOCUMENTS 4,340,479 A * 7/1982 Pall ............................ 210/490

(Continued)

FOREIGN PATENT DOCUMENTS

EP 0251187 1/1988

(Continued)

OTHER PUBLICATIONS www.pall.com/datasheet_MicroE_2752.asp, "Ultipleat P-Nylon Filter (microlithography)", Mar. 2001.*

(Continued)

*Primary Examiner*—Cynthia H Kelly
*Assistant Examiner*—Connie P Johnson
(74) *Attorney, Agent, or Firm*—Knobbe, Martens, Olson & Bear, LLP

(57) ABSTRACT

A technique to acquire a photoresist composition which can reduce occurrence of defects of a resist pattern after development is provided. Further, a technique to obtain a photoresist composition having excellent storage stability characteristics as a resist solution (storage stability); and a technique to obtain a photoresist composition which reduces the change of sensitivity and resist pattern size after treatment almost completely are provided. A photoresist composition containing a resin component (A), an acid-generating component (B) for generating an acid under exposure, and an organic solvent (C) is passed through a first filter 2a equipped with a first membrane having zeta potential of more than −20 mV but no more than 15 mV in distilled water of pH 7.0.

11 Claims, 3 Drawing Sheets

U.S. PATENT DOCUMENTS

| | | | |
|---|---|---|---|
| 4,707,266 A * | 11/1987 | Degen et al. | 210/638 |
| 4,748,474 A * | 5/1988 | Kurematsu et al. | 430/119.71 |
| 5,019,723 A * | 5/1991 | Tran | 307/400 |
| 5,215,662 A * | 6/1993 | Johnson et al. | 210/500.38 |
| 5,350,714 A * | 9/1994 | Trefonas et al. | 438/780 |
| 6,015,493 A | 1/2000 | Smith et al. | |
| 6,103,122 A * | 8/2000 | Hou et al. | 210/502.1 |
| 6,596,458 B1 | 7/2003 | Sato et al. | |
| 6,787,283 B1 | 9/2004 | Aoai et al. | |
| 6,830,867 B2 * | 12/2004 | Kodama | 430/270.1 |
| 2001/0010890 A1 | 8/2001 | Hatakeyama et al. | |
| 2001/0026901 A1 | 10/2001 | Maeda et al. | |
| 2002/0060184 A1 * | 5/2002 | Pulek et al. | 210/488 |
| 2002/0124798 A1 | 9/2002 | Kitano et al. | |
| 2002/0136980 A1 | 9/2002 | Sasaki et al. | |
| 2002/0187421 A1 * | 12/2002 | Hioki et al. | 430/270.1 |
| 2003/0031950 A1 | 2/2003 | Uenishi et al. | |
| 2003/0170559 A1 * | 9/2003 | Mizutani et al. | 430/270.1 |
| 2004/0106062 A1 * | 6/2004 | Petrov et al. | 430/270.1 |
| 2006/0191854 A1 * | 8/2006 | Sakillaris et al. | 210/746 |

FOREIGN PATENT DOCUMENTS

| | | |
|---|---|---|
| EP | 1 193 556 A | 4/2002 |
| JP | A-63-126502 | 5/1988 |
| JP | H06-032817 | 2/1994 |
| JP | H06-289614 | 10/1994 |
| JP | 2001-022072 | 1/2001 |
| JP | 2001-056556 | 2/2001 |
| JP | 2001-125269 | 5/2001 |
| JP | 2001-170539 | 6/2001 |
| JP | 2001-350266 | 12/2001 |
| JP | 2002-062667 | 2/2002 |
| JP | 2002-099076 | 4/2002 |
| JP | 2002-201232 | 7/2002 |
| JP | 2002-526172 | 8/2002 |
| JP | 2002-296779 | 10/2002 |
| JP | 2003-330202 | 11/2003 |
| WO | WO 00/20053 | 4/2000 |
| WO | WO 2004/067688 | 8/2004 |
| WO | WO 2004/069959 A2 | 8/2004 |

OTHER PUBLICATIONS

Pall Corporation, "PhotoKleen EZD-2 Filter Assembly", 2001, pp. 1-2.*

Pall Corporation, "Microlithography Filtration: Enables Shrinking Device Geometries", 2008, pp. 1-8.*

Office Action and Search Report issued on Jun. 17, 2008, on the counterpart Taiwanese Patent Application No. 093102020.

Gotlinsky et al., "The Effect of Sub-0.1MUM Filtration on 248nm Photoresist Performance," Solid State Technology, Pennwell Corporation, Tulsa, OK, US; vol. 43, No. 7, Jul. 1, 2000; pp. 202-204, 206.

Ikenouchi et al: "Photoresist Filtering System Using Two Step Filtering," IP.COM Journal, IP.COM Inc., West Henrietta, NY, US, Sep. 1, 1991.

Supplementary European Search Report for European Patent Application No. 03780900.1, dated Apr. 7, 2009, and the transmission letter establishing receipt on May 11, 2009.

Office Action issued on corresponding Japanese Patent Application No. 2004-031285, dated Mar. 10, 2009.

Office Action issued on counterpart Japanese Patent Application No. 2003-416583, dated Apr. 21, 2009.

Office Action issued on corresponding European Patent Application No. 04706302.9, dated Feb. 10, 2010.

* cited by examiner

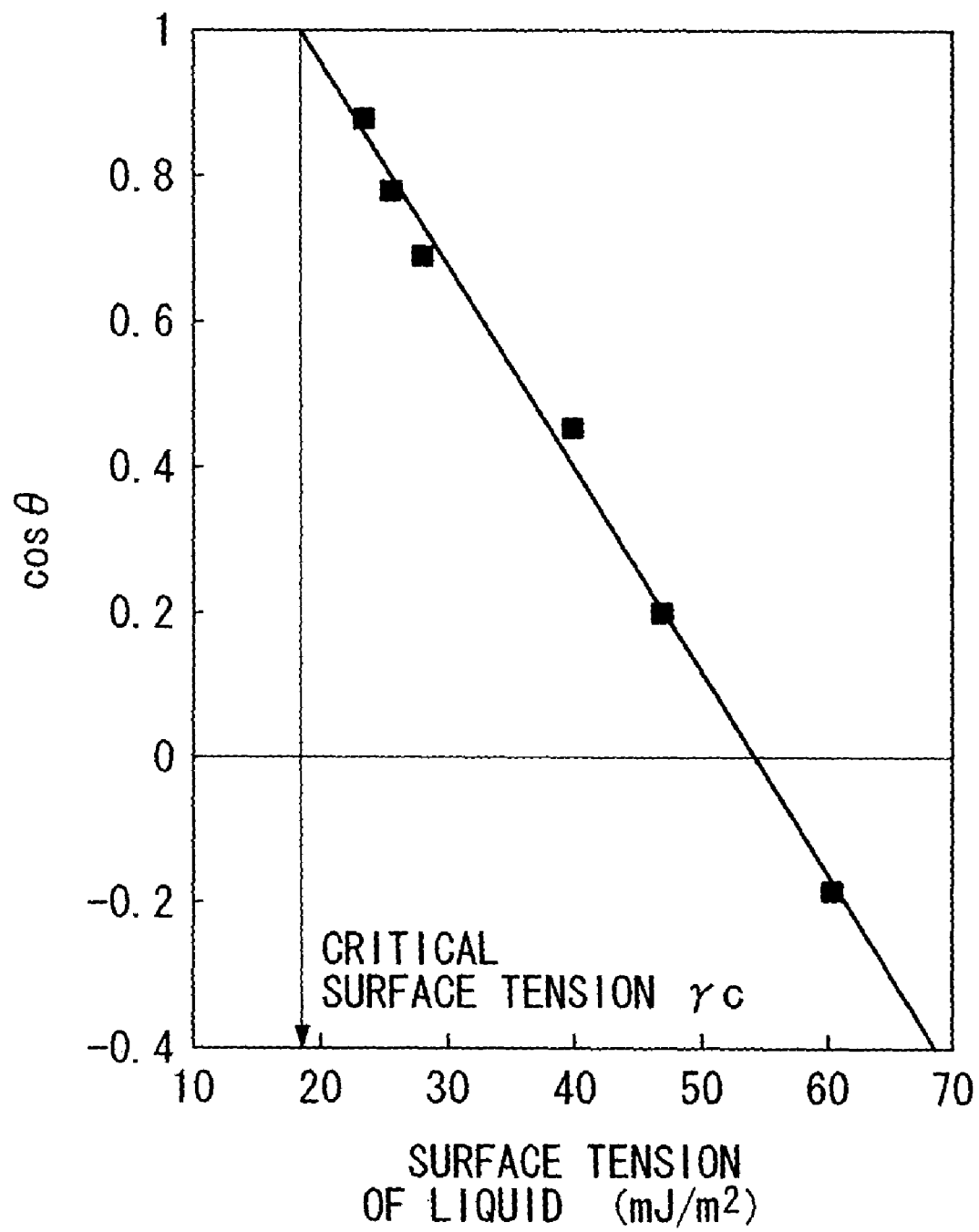

PROCESS FOR PRODUCING PHOTORESIST COMPOSITION, FILTER, COATER AND PHOTORESIST COMPOSITION

This application is the U.S. National Phase under 35 U.S.C. §371 of International Application PCT/JP2003/016268, filed Dec. 18, 2003, which claims priority to Japanese Patent Application No. 2002-368931, filed Dec. 19, 2002, and No. 2003-416583, filed Dec. 15, 2003. The International Application was not published under PCT Article 21(2) in English.

TECHNICAL FIELD

The present invention relates to a method for manufacturing a photoresist composition, a filtering device, a coating device and a photoresist composition.

The disclosures of the following applications are herein incorporated: Japanese Patent Application No. 2002-368931 and Japanese Patent Application No. 2003-416583.

BACKGROUND ART

For example, as described in Japanese Unexamined Patent Application, First Publication No. 2002-296779 (patent reference 1), a chemically amplified photoresist composition obtained by using a KrF excimer laser, an ArF excimer laser, an $F_2$ excimer laser, an EUV (extreme UV ray) or an EB (electron beam) or the like for a light source (radiation source) typically contains a resin component (A), an acid-generating component (B) for generating an acid under exposure and an organic solvent (C) capable of dissolving these components.

A resist pattern having high resolution, high sensitivity and an excellent shape or the like is required of the chemically amplified photoresist composition.

A resist pattern having high resolution of 0.15 µm or lower has recently been demanded, and the reduction of the defects (surface defects) of the resist pattern after development over that of a conventional resist pattern has been further demanded in addition to the characteristics.

The defect typically is an actual nonconformity defection when the resist pattern after development is observed from directly above by a surface defect observation apparatus (trade name "KLA") manufactured by, for example, KLA Tencor Company. This nonconformity is, for example, scum, bubbles, waste or a bridge between resist patterns or the like after development.

So as to reduce the defects, improvements in the resist composition such as a resin component of the resist composition, an acid-generating component and a solvent component have been mainly attempted [Japanese Unexamined Patent Application, First Publication No. 2001-56556 (patent reference 2)].

While a resist solution (a photoresist composition of a solution state) is stored, a storage stability characteristic as a resist solution (while the photoresist composition is stored, solid foreign matter is generated in the photoresist composition; storage stability) in which minute particles are generated also poses a problem, and the improvement thereof is desired.

For the improvement of the storage stability characteristic as a resist solution, the improvement of the resist composition has been attempted in the same manner as the above case [Japanese Published Unexamined Patent Application No. 2001-22072 (patent reference 3)].

[Patent reference 1] Japanese Unexamined Patent Application, First Publication No. 2002-296779
[Patent reference 2] Japanese Unexamined Patent Application, First Publication No. 2001-56556
[Patent reference 3] Japanese Unexamined Patent Application, First Publication No. 2001-22072
[Patent reference 4] Japanese Unexamined Patent Application, First Publication No. 2002-62667
[Patent reference 5] Japanese Unexamined Patent Application, First Publication No. 2001-350266

DISCLOSURE OF THE INVENTION

However, the techniques described in patent references 2 and 3 have not attained a sufficient effect yet.

The generation of the above minute particulates may cause the above defects, and the improvement of the storage stability characteristic as a resist solution is strongly desired for the reduction of the defects.

However, up until now, methods for sufficiently improving the defects and storage stability of the resist pattern after development have not been known.

A method for manufacturing the photoresist composition obtained by reducing the amount of the particulates in the photoresist composition circulated through a line by passing the photoresist composition through a filter is proposed in Japanese Unexamined Patent Application, First Publication No. 2002-62667 (patent reference 4).

As shown in patent reference 4, a method for manufacturing the photoresist composition by the manufacture of the photoresist composition and passing the photoresist composition through the filter has been known. However, the method has not sufficiently reduced the above defects of the resist pattern after development and improved the storage stability.

A method for manufacturing a photoresist composition by passing a photoresist composition through a filter having positive zeta potential has been proposed in Japanese Published Unexamined Patent Application No. 2001-350266 (patent reference 5). However, according to investigation by the inventors, the treatment of the photoresist composition yielded by the method described in patent reference 5 may cause alteration of the composition. The alteration of the composition has a disadvantage since the alteration of the composition causes alteration of sensitivity of the photoresist composition or alteration of the resist pattern size.

In addition, of the various types of resist pattern defects that exist following developing, resolving the defect problems that appear during the formation of very fine resist patterns with pattern sizes of no more than 130 nm or which are produced using ArF excimer lasers onwards as the light source, namely, ArF excimer lasers, $F_2$ excimer lasers, EUV, and EB and the like, is now becoming critical.

That is, it has been a very big problem to reduce defects such as minute scum and microbridges after development, which did not cause a large problem in the resist for the KrF excimer laser. However, the problems have not been solved by the above prior art.

The present invention has been accomplished in view of the foregoing. It is an object of the present invention to provide a technique to obtain a photoresist composition which can reduce occurrence of defects in the resist pattern after development, particularly the occurrence of minute scum and microbridges.

It is another object of the present invention to provide a technique to obtain a photoresist composition having an excellent storage stability characteristic as a resist solution (storage stability).

It is another object of the present invention to provide a technique to obtain a photoresist composition which prevents the alteration of sensitivity and resist pattern size after treatment almost completely.

To attain the above object, the present invention applies the following constitutions.

According to a first aspect of the present invention, there is provided a method for manufacturing a photoresist composition comprising the step of passing a photoresist composition containing a resin component (A), an acid-generating component (B) for generating an acid under exposure and an organic solvent (C) through a first filter equipped with a first membrane having zeta potential of more than −20 mV but no more than 15 mV in distilled water of pH 7.0.

According to a second aspect of the present invention, there is provided a method for manufacturing a photoresist composition comprising the step of passing a photoresist composition containing a resin component (A), an acid-generating component (B) for generating an acid under exposure and an organic solvent (C) through a first filter equipped with a first membrane having a critical surface tension of 70 dyne/cm or more.

According to a third aspect of the present invention, there is provided a filtering device comprising:

a storing part for storing a photoresist composition containing a resin component (A), an acid-generating component (B) for generating an acid under exposure, and an organic solvent (C); and a first filtering part for passing the photoresist composition through, wherein the first filtering part has a first filter equipped with a first membrane having zeta potential of more than −20 mV but no more than 15 mV in distilled water of pH 7.0.

According to a fourth aspect of the present invention, there is provided a filtering device comprising:

a storing part for storing a photoresist composition containing a resin component (A), an acid-generating component (B) for generating an acid under exposure, and an organic solvent (C); and a first filtering part for passing the photoresist composition through, wherein the first filtering part has a first filter equipped with a first membrane having a critical surface tension of 70 dyne/cm or more.

According to a fifth aspect of the present invention, there is provided a coating device for a photoresist composition equipped with the filtering device according to the third or fourth aspect of the present invention.

According to a sixth aspect of the present invention, there is provided a photoresist composition obtained by the method for manufacturing according to the first or second aspect of the present invention.

According to a seventh aspect of the present invention, there is provided a method for manufacturing a photoresist composition comprising the step of passing a photoresist composition containing a resin component (A), an acid-generating component (B) for generating an acid under exposure, and an organic solvent (C) through a first filter equipped with a first membrane having a pore diameter of 0.04 μm or less and made of a NYLON membrane.

According to an eighth aspect of the present invention, there is provided a filtering device comprising:

a storing part for storing a photoresist composition containing a resin component (A), an acid-generating component (B) for generating an acid under exposure, and an organic solvent (C); and a first filtering part for passing the photoresist composition through, wherein the first filtering part has a first filter equipped with a first membrane made of a NYLON membrane of 0.04 μm or less.

According to a ninth aspect of the present invention, there is provided a coating device for a photoresist composition equipped with the filtering device according to the eighth aspect of the present invention.

The defects appear on the resist pattern persistently, and are different from so-called pinhole defects in the resist coating film before pattern formation.

Herein, "(meta)acryllate" means at least one of acrylate and methacrylate. "Construction unit" means a unit derived from a monomer constituting the polymer.

The present invention can provide a technique to obtain the photoresist composition which can reduce the occurrence of defects of the resist pattern after development, particularly the occurrence of minute scum and microbridges.

Also, the present invention can provide a technique to obtain a photoresist composition having an excellent storage stability characteristic as a resist solution (storage stability).

Also, the present invention can provide a technique to obtain a photoresist composition which prevents variation of the sensitivity and resist pattern size after treatment almost completely.

BRIEF DESCRIPTION OF THE DRAWINGS

FIG. 3 is a graph of a Zisman Plot.

BEST MODE FOR CARRYING OUT THE INVENTION

First Embodiment

[The Procedure and Device of Operation]

Figure 1:
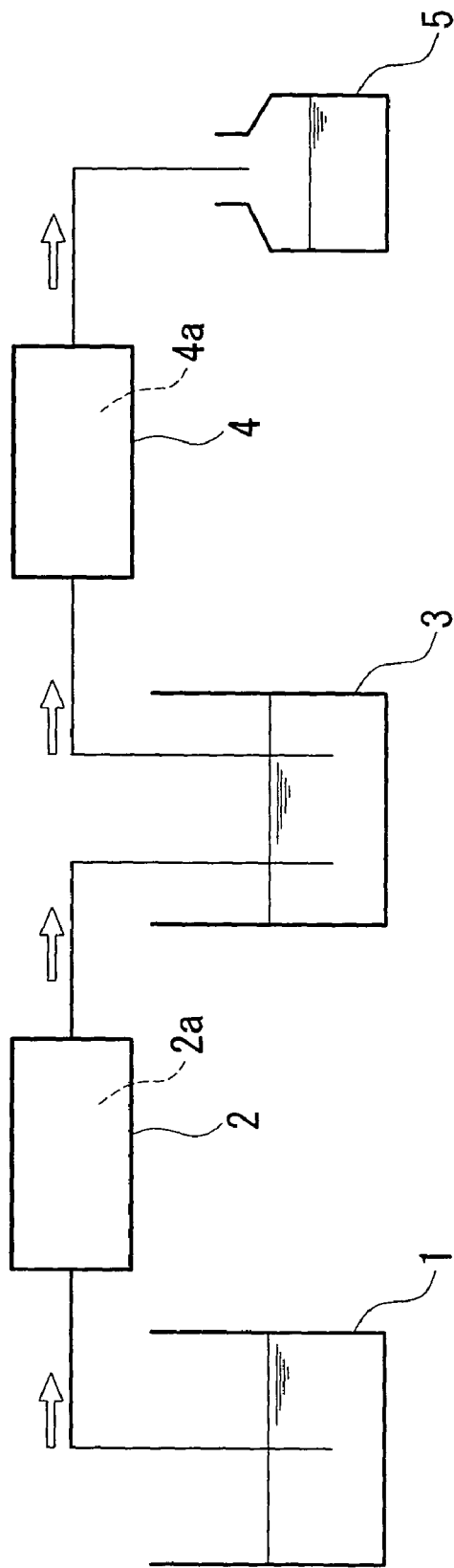
FIG. 1 is a schematic constitution diagram showing an example of a filtering device of the present invention.

Hereinafter, one example of the method for manufacturing the photoresist composition and filtering device of the present invention will be described according to the procedure.

First, a filtering device is prepared, which is provided with a first filtering part equipped with a first filter having a first membrane (filtering membrane) having zeta potential of more than −20 mV but no more than 15 mV in distilled water of pH 7.0, and a second filtering part equipped with a second filter having a second membrane (filtering membrane) made of polyethylene or polypropylene.

The zeta potential is the electric potential of diffused ion layers around charged particles in a liquid.

In more detail, when ultrafine powder has electric charge in the liquid, so as to eliminate the electric charge, ions having reverse electric charge are drawn to the fine powder by electrostatic force, and thereby electric double layers are formed. The potential of the surface of the outermost of the double layers is the zeta potential.

It is said that measurement of the zeta potential is effective for determining the surface structure of the fine powder and fine particles. The term "zeta potential" used hereinafter means "zeta potential in distilled water of pH 7.0." The numerical value in the present invention is a nominal value given by a manufacturer of the filter.

The first embodiment uses a filter equipped with a membrane having the zeta potential of a specific range of the nominal value given by the manufacturer of the filter.

By using a membrane having specific zeta potential, defects, particularly minute scum and microbridges can be effectively reduced, and the storage stability as a resist solution can be effectively improved.

In the present invention, for example, the filter may be equipped with a membrane for passing at least the photoresist composition through, and a supporting member for supporting the membrane. Filters having various materials and various pore diameters are manufactured and sold as filters for filtering ultrapure water, high-purity chemical liquids and fine chemicals or the like by filter manufacturers such as Japan Pall Corporation, Advantec Toyo Corporation, Mykrolis Corporation and Kitz Corporation.

In the present invention, the photoresist composition passed through the filter may be a photoresist composition having the same concentration as that of manufactured products, or may be a so-called undiluted solution having a solid content concentration of about 8 to about 15% by mass before dilution.

The term "filtration" used in the present invention contains typically used chemical "filtration" ("only the phase [gas or liquid] of a fluid which is penetrated by using a membrane and phase of "porous substance, and half-solid phase or solid is separated from the phase of the fluid," Encyclopaedia Chimica 9 Jul. 31, 1962 publication, Kyoritsu Shuppan Co., Ltd.). In addition, the term "filtration" contains the case of merely "passing through a filter," that is, the case that the half-solid phase or solid trapped by the membrane when passing through the membrane cannot be visually confirmed or the like.

The photoresist composition containing the resin component (A), the acid-generating component (B) for generating the acid under exposure, and the organic solvent (C) are conventionally prepared.

Then, as shown in FIG. 1, when the photoresist composition is supplied to a first filtering part 2 from a storage tank 1 (the storing part for the photoresist composition), the photoresist composition is passed through a first membrane in a first filter 2a provided in the first filtering part 2 and is filtered. The filtrate is supplied to a first filtrate storage tank 3. When the filtrate (photoresist composition) is then supplied to a second filtering part 4 from the first filtrate storage tank 3, the filtrate is passed through a second membrane in a second filter 4a provided in the second filtering part 4 and is filtered.

Finally, the filtrate [photoresist composition] is put into a container 5 as a manufactured product.

Herein, although the second filtering part 4 (the second filter 4a) is not indispensable, the burden of filtration on the first filter 2a of the first filtering part 2 can be reduced by using the second filter 4. In addition, it is preferable in that the effect of defect reduction and the storage stability characteristic as a resist solution also improve.

The membrane of the second filter 4a is not particularly limited as long as the membrane is conventionally used for the filtration application or the like of the photoresist composition. Examples of the membrane include a fluororesin such as PTFE (polytetrafluoroethylene); a polyolefin resin such as polypropylene or polyethylene; and a polyamide resin such as NYLON 6 (registered trademark) and NYLON 66 (registered trademark).

Of these, when one membrane selected from the membranes made of polyethylene and polypropylene is combined with the first filter, both the defect reduction effect and the storage stability characteristic as a resist solution are preferable as compared with that of the other membranes. The membrane made of polypropylene contains a high-density polypropylene (HDPE) membrane and an ultrahigh molecular weight polypropylene (UPE) in addition to normal polypropylene.

In the specific procedure for performing the filtration using the second filter 4a after the step of filtering by using the first filter 2a equipped with the first membrane of the present invention, the photoresist composition is first filtered by the first filter 2a equipped in the first filtering part 2 of the present invention. The photoresist composition is then supplied to the second filtering part 4, and for example, the second filtration is performed by using the second filter 4a equipped with the membrane made of polyethylene or polypropylene. The photoresist composition is finally filtered by a filter equipped with the membrane made of PTFE. In this case, it is not necessary to perform filtration by the last filter equipped with the membrane made of PTFE. However, it is preferable to perform the filtration.

The step of pre-filtration for filtering once or twice using the same filter as the second filter 4a may also be provided before the step of filtering using the first filter 2a. The filter used at the step of pre-filtration is the same as the membrane of the above second filter 4a, and the membrane is preferably selected from membranes made of polypropylene and polyethylene.

In a specific procedure for combining the pre-filtration using the second filter 4a with the step for passing the composition through the first filter 2a equipped with the first membrane, for example, the filtration is first performed by a filter equipped with a membrane made of PTFE. A second filtration is then performed by the second filter 4a equipped with the membrane made of polypropylene or polyethylene. The photoresist composition is then supplied to the first filtering part 2, and is filtered by the first filter 2a provided in the first filtering part 2. Although it is not necessary to perform the filtration by the first filter equipped with the membrane made of the PTFE in this case, it is preferable to perform the filtration.

An operation for performing the filtration using the second filter 4a may be combined both before and after filtration of the first filter 2a provided in the first filtering part 2 in the present invention.

If the resist composition is filtered by the first filter 2a at least once in the present invention, an excellent effect is obtained in view of the defect reduction effect and the storage stability characteristic as a resist solution. The combination or the like of the number of times (number of times of filtration) for passing through the membrane and the filter equipped with the other kinds of the membranes is not particularly limited, and can be suitably adjusted for any purpose.

Particularly, filtration by passing the composition through the first filter 2a is performed once or twice, and filtration by passing the composition through the second filter 4a is finally performed. Thereby, the method excels in both the defect reduction effect and the storage stability characteristic as a resist solution. When the filtration using the first filter 2a is performed twice or more, filtrate is passed through the first filtering part 2 once by the conventional method, and the thereby filtered filtrate may be supplied to the first filtering part 2 again.

The filtering device can be suitably selected by the combination of the filters in the filtration step, and can be constituted in various forms by providing a tank for storing the photoresist composition before and after filtration such as the storing part suitably before and after one kind or two kinds or more of filters (filtering parts).

Various forms can be employed for the filtering device of the present invention.

For example, the filtering device may be a device used for the above manufacturing process of the photoresist composition, or may be a device mounted on a coating device such as a spinner or a coater-developer. That is, the coating device of the present invention represents a comprehensive concept containing not only a so-called coating device for the photoresist composition but also a coating device united with other devices such as a developer. These coating devices have a nozzle, and the photoresist composition is usually supplied on a wafer (substrate) from the nozzle to coat the photoresist composition onto the wafer.

Therefore, before the photoresist composition is supplied onto the wafer from the nozzle, the filtering device of the present invention may be incorporated in the above coating device or the like so that the photoresist composition is passed through the membrane of the filtering device of the present invention. Therefore, before the photoresist composition is supplied on the wafer, the cause of the defects in the photoresist composition is removed, and the defects, particularly minute scum and microbridges can be effectively reduced.

The specific example of the coating device equipped with the filtering device of the third, fourth or eighth aspect of the present invention which is the fifth or ninth aspect of the present invention will be described in Example 4-1 and Comparative Example 4-1 described below.

The membrane used for the first filter 2a has zeta potential of more than −20 mV but no more than 15 mV; preferably more than −20 mV but no more than 10 mV; more preferably more than −20 mV but no more than 10 mV; and particularly preferably negative zeta potential (provided that it is less than −20 mV). The membrane is preferable because it is excellent in the defect reduction effect, particularly of minute scum and microbridges, and in the storage stability characteristic as a resist solution.

The negative zeta potential is −5 mV or less (provided that it is larger than −20 mV), preferably −10 to −18 mV, and more preferably −12 to −16 mV. The membrane of the first filter is particularly preferably made of NYLON (polyamide), and particularly the filter has a membrane satisfying the preferable numerical value range of the negative zeta potential and is made of NYLON.

A filter equipped with a membrane (for example, NYLON 6 (registered trademark) or NYLON 66 (registered trademark) or the like) denatured by charge modification and made from polyamide is common as a filter equipped with a membrane showing positive zeta potential among the membranes having the specific zeta potential used for the first filter 2a.

Examples of filters equipped with membranes showing negative zeta potential include ULTIPORE N66 (product name, manufactured by Japan Pall Corporation, zeta potential of about −12 to −16 mV) which is not denatured by charge modification and is made of NYLON 66 (registered trademark); and ULTIPLEAT (registered trademark) P-NYLON Filter (product name, manufactured by Japan Pall Corporation, zeta potential of about −12 to −16 mV, pore diameter of 0.04 μm) made of NYLON 66 (registered trademark). Of these, the latter ULTIPLEAT (registered trademark) is more preferable.

The filter equipped with the membrane showing the negative zeta potential is suitable for the method for manufacturing the photoresist composition which is the first, second or seventh aspect of the present invention, and the filtering device of the third, fourth or eighth aspect of the present invention.

Examples of the filter used in the coating device equipped with the filtering device of the third, fourth or eighth aspect of the present invention which is the fifth or ninth aspect of the present invention include a P-NYLON FILTER (product name, manufactured by Japan Pall Corporation, zeta potential of about −12 to −16 mV, pore diameter of 0.04 μm) equipped with a membrane in which the removable form is changed for the coating device and which is made of NYLON 66 (registered trademark). In the removable form of the coating device, only the filter is preferably removed and replaced in the coating device equipped with the filtering device.

In the present invention, the filter with the membrane having the negative zeta potential is preferable which is excellent in the defect reduction effect, particularly of minute scum and microbridges, and the storage stability characteristic as a resist solution. Although the reason is not clear, the present inventors speculate that the filter with the membrane having the specific zeta potential improves the selective filtration efficacy with respect to a resin having high content of the specific particles which affect the defects and the storage stability as a resist solution, particularly, units having a polar group such as a lactone group or a hydroxyl group such as construction units (a2) and (a3) described below. The use of the membrane having negative zeta potential is preferable, because it provides a photoresist composition in which the sensitivity and the size of the resist pattern after being filtrated are substantially unchanged even if the photoresist composition itself is filtrated. The present inventors speculate that the reason is because the composition is substantially unchanged, and for example, a quencher such as a nitrogen-containing organic compound or an organic acid is substantially unadsorbed.

The pore diameter of the membrane used for the first filter 2a is the nominal value given by the manufacturer of the filter. The combination (the combination of the form of the filter, a kind of membrane and the number of times for passing through the membrane or the like) of the filtering part is suitably adjusted in view of the productivity and the effect of the present invention.

For example, when only the first filter 2a is used without using the second filter 4a, a product in which the pore diameter of the membrane of the first filter 2a is 0.2 μm or less, preferably 0.1 μm or less, and more preferably 0.04 μm or less is preferably used in view of the effect. However, if the pore diameter becomes too small, the productivity (the throughput of the manufacture of the resist composition and coating) tends to be reduced. Although the lower limit is about 0.01 μm, the pore diameter is most practically set to 0.02 μm or more.

When the photoresist composition is filtered by combining the first filter with the second filter 4a, a product of 0.1 μm or less, more preferably 0.04 μm or less is preferably used as the second filter 4a in the same way in view of the effect. Although the lower limit is about 0.01 μm, the pore diameter is practically set to 0.02 μm or more.

In each case, it is preferable that the pore diameter of the membrane used for the first filter 2a satisfies the range of 0.01 to 0.04 μm, preferably 0.02 to 0.04 μm in view of the defect reduction effect, the effect of improvement in the storage stability characteristic as a resist solution, and the productivity. The pore diameter is preferably 0.04 μm in view of the compatibility of the effect and productivity.

The pore diameter of the membrane of the second filter 4a is 0.2 μm or less, more preferably 0.1 μm or less, and more preferably 0.02 μm or less. Although the lower limit is not particularly limited, the pore diameter is most practically 0.02 μm or more.

It is preferable that the pore diameter of the membrane used for the second filter 4a satisfies the range of 0.02 to 0.1 μm in view of the defect reduction effect, and the effect of improvement in the storage stability characteristic as a resist solution.

The pore diameter of the second filter herein is the nominal value of the manufacturer of the filter in the same way.

A so-called disk type or a cartridge type or the like are typically used as the shape (form) of the first filter 2a and second filter 4a.

It is preferable that the surface area (filtration area) of the first filter 2a and second filter 4a is suitably adjusted according to the throughput or the like of the photoresist composition, and the surface area is not particularly limited. For example, the surface area may be adjusted in the same way as usual.

The filtration pressures [withstanding differential pressure] of the first filter 2a and second filter 4a are not particularly limited. For example, the filtration pressure is set to the same condition as usual.

The flow velocity of the photoresist composition supplied to the first filtering part 2 and the second filtering part 4 is suitably adjusted by the characteristic and surface area or the like of the filter, and for example, is set to the same condition as usual.

In the first embodiment, by using the membrane having the specific zeta potential, defects, particularly minute scum and microbridges can be effectively reduced, and the storage stability as a resist solution can be effectively improved. If the membrane having negative zeta potential is particularly used, a photoresist composition in which the sensitivity and the size of the resist pattern are substantially unchanged is also effectively obtained.

The scum and defects of the resist pattern can be estimated as the so-called number of surface defects by a surface defect observation apparatus KLA2132 (product name) manufactured by, for example, KLA Tencor Company. The microbridges can be confirmed by observing using a measuring SEM or the like.

The storage stability as a resist solution can be evaluated by measuring the amount of foreign matter by using a particle counter.

For example, the storage stability characteristic as a resist solution of the photoresist composition after storing at 40° C. or at room temperature after manufacture is evaluated by using a liquid particle counter (manufactured by Rion Company, product name: particle sensor KS-41 and KL-20K). The device counts the number of particles having a particle diameter of 0.15 to 0.3 μm or more per 1 cm$^3$. The measuring limit is usually 20000 pieces/cm$^3$ or more.

The amount of foreign matter in the photoresist composition immediately after manufacture is usually about 10 to 30 pieces/cm$^3$ or less in terms of particles of 0.3 μm or more, and is about 900 pieces/cm$^3$ or less in terms of particles of 0.15 μm or more. A characteristic in which the storage stability characteristic as a resist solution is almost unchanged as compared with that immediately after manufacture, preferably after a half year is obtained by applying the present invention.

Whether the composition is changed or not can be evaluated by analyzing and comparing the concentration of the material contained in the photoresist composition before and after the step for passing through the filter, and by measuring the sensitivity (the optimal light exposure) and the variation of the size of the resist pattern at the time of forming the resist pattern using the photoresist composition.

Second Embodiment

[The Procedure and Device of Operation]

The second embodiment provides a method for manufacturing a photoresist composition comprising the step of passing a photoresist composition containing a resin component (A), an acid-generating component (B) for generating an acid under exposure, and an organic solvent (C) through a first filter equipped with a first membrane having a critical surface tension of 70 dyne/cm or more. In addition, the second embodiment provides a filtering device comprising: a storing part for storing a photoresist composition containing a resin component (A), an acid-generating component (B) for generating an acid under exposure, and an organic solvent (C); and a first filtering part for passing the photoresist composition through, wherein the first filtering part has a first filter equipped with a first membrane having a critical surface tension of 70 dyne/cm or more.

The second embodiment is different from the first embodiment in that the first filtering part 2 shown in FIG. 1 is equipped with the first filter 2a having the first membrane satisfying the characteristic of the critical surface tension of 70 dyne/cm or more.

The critical surface tension is a physical property known as "wettability" of the surface physical property of a polymer, and is a solid surface tension ($\gamma c$). Since $\gamma c$ cannot be directly evaluated in the same manner as in liquid, $\gamma c$ is obtained from the formula of Young-Dupre and a Zisman Plot as follows.

The formula of Young-Dupre:

$$\gamma LV \cos \theta = \gamma SV - \gamma SL$$

Wherein θ: contact angle, S: solid, L: liquid, and V: saturated vapor.

When water is used as the liquid, θ is 90°. When θ is 90° or more, the surface has hydrophobicity, and when θ is near 0°, the surface has hydrophilicity.

Zisman Plot (see FIG. 3):

The contact angle θ is measured by using various liquids having surface tension γLV, and γLV and cos θ are plotted. If γLV approaches γSV of the solid surface, θ becomes small, and the contact angle θ becomes 0° at a value of γLV. The γLV of the liquid when θ becomes 0° is defined as the surface tension of the solid, that is, the critical surface tension (γc).

γc in the membrane (membrane processed for the filter) (Medium) used for the filter, and a polymer material (Material) before being used for the filter (before being processed for the filter) is as follows.

Example of a membrane (Medium) with which the filter is equipped and which is made of NYLON 66: 77 dyne/cm (the unit is omitted below)

General NYLON 66 (Material) with which the filter is not equipped: 46

Example of a membrane (Medium) with which the filter is equipped and which is made of polyethylene or polypropylene: 36

Example of a membrane (Medium) with which the filter is equipped and which is made of polytetrafluoroethylene (PTFE): 28

General PTFE (Material) with which the filter is not equipped: 18.5, etc.

Thus, γc of the membrane (Medium) with which the filter is processed so as to function as the filter is equipped is different from that of the polymer material (Material).

γc in the second embodiment means that the critical surface tension of the first membrane with which the first filter 2a is equipped is 70 dyne/cm or more, and is not the value of the polymer material (Material). This difference is produced by processing the polymer material (Material) so as to be equipped in the filter. Since different processing methods cause different values of critical surface tension in the same material, it is preferable that the nominal value of the critical surface tension of the membrane of the filter is respectively confirmed or the measured value is obtained.

The reduction of defects, particularly minute scum and microbridges, and the effect of the improvement of the storage stability as a resist solution are acquired by using a filter equipped with a membrane having a critical surface tension of 70 dyne/cm or more. Since the defect reduction effect becomes inferior otherwise, the upper limit is 95 dyne/cm or less. A more preferable range is 75 dyne/cm or more and 90 dyne/cm or less, and further preferable range is 75 dyne/cm or more and 80 dyne/cm or less.

Although the value of the critical surface tension in the present invention is the nominal value of the manufacturer of the filter, the values can be easily obtained by dropping multiple liquids having known surface tensions onto the targeted membrane, and discerning the boundary of one liquid soaking into the membrane by its own weight and the other liquid not soaking.

Examples of filters satisfying the value of the critical surface tension in the present invention include the above ULTIPLEAT (registered trademark) P-NYLON FILTER (product name: manufactured by Japan Pall Corporation, zeta potential about −12 to −16 mV, pore diameter of 0.04 μm, 77 dyne/cm) made of NYLON 66 (registered trademark).

On the other hand, examples of filters which do not satisfy the value of the critical surface tension in the present invention include a filter equipped with a membrane composed by available commercial fluororesin such as PTFE, or a polyolefin resin such as polypropylene or polyethylene.

The value of the critical surface tension of the membrane in these filters is about 50 dyne/cm or less as described above.

In the second embodiment, membranes which satisfy the value of the above critical surface tension and are not denatured by charge modification are preferable. "charge modification" has the same meaning as the expression of "compulsive potential modification" which is not subjected to charge modification has the same specific zeta potential as the first filter $2a$ in the first embodiment. It is preferable that use of a membrane having zeta potential of more than −20 mV but no more than 15 mV; preferably more than −20 mV but no more than 10 mV; more preferably more than −20 mV but less than 10 mV; particularly preferably having negative zeta potential (more than −20 mV) can provide a photoresist composition in which the sensitivity and size of the resist pattern after being filtrated are substantially unchanged even if the photoresist composition itself is filtrated. The negative zeta potential is −5 mV or less (more than −20 mV), preferably −10 to −18 mV, more preferably −12 to −16 mV.

The preferable embodiment of the pore diameter of the membrane is the same as that of the first embodiment. Particularly, products are preferably used, in which the pore diameter of the membrane of the first filter $2a$ is 0.04 μm or less. However, if the pore diameter is too small, the productivity (the manufacture of resist composition and the throughput of coating) tends to be reduced. Although the lower limit is about 0.01 μm, the lower limit is most practically 0.02 μm or more.

In the second embodiment, the effects of reduction of defects, particularly minute scum and microbridges, and improvement of the storage stability as a resist solution can be acquired by using a filter equipped with a membrane having a critical surface tension of 70 dyne/cm or more.

Particularly, even if the photoresist composition itself is filtered by using the membrane having the above zeta potential, it is preferable that a photoresist composition is acquired, in which the composition is substantially unchanged after being processed and change of the sensitivity or size of resist pattern is not substantially caused.

Although the reason is not clear, since the surface of the membrane is wetted easily with the resist composition when the critical surface tension is 70 dyne/cm or more, the present inventors speculate that the selective filtration efficacy is improved with respect to the specific particles affecting the defects and reduction of the storage stability as a resist solution, particularly, the resin with high content of a unit having a polar group such as a lactone group or a hydroxyl group such as construction units (a2) and (a3) described below.

The present inventors speculate that the alterlation of the electric charge is decreased and the absorption of the specific substance into the surface of the membrane is reduced since the membrane has the above zeta potential, and as a result, composition change of the photoresist composition can be reduced.

Third Embodiment

[The Procedure of Operation and Device]

The third embodiment provides a method for manufacturing a photoresist composition comprising the step of passing a photoresist composition containing a resin component (A), an acid-generating component (B) for generating an acid under exposure, and an organic solvent (C) through a first filter equipped with a first membrane having a pore diameter of 0.04 μm or less and made of a NYLON membrane. Also, the third embodiment provides a filtering device comprising: a storing part for storing a photoresist composition containing a resin component (A), an acid-generating component (B) for generating an acid under exposure, and an organic solvent (C); and a first filtering part for passing the photoresist composition through, wherein the first filtering part has a first filter equipped with a first membrane made of a NYLON membrane of 0.04 μm or less.

The third embodiment is different from the first embodiment in that the first filtering part 2 shown in FIG. 1 is equipped with the first filter $2a$ having the NYLON membrane having the pore diameter of 0.04 μm or less.

Examples of the filters having membrane include the above ULTIPLEAT (registered trademark), P-NYLON FILTER (product name, manufactured by Japan Pall Corporation, zeta potential of about −12 to 16 mV, pore diameter of 0.04 μm, 77 dyne/cm) made of NYLON 66 (registered trademark).

Since the first filter equipped with the first membrane composed by the NYLON membrane having the pore diameter of 0.04 μm or less is used in the third embodiment, as described in the second embodiment, general NYLON 66 (Material) with which the filter is not equipped is not contained in the NYLON membrane of the filter. Therefore, NYLON 66 (Material) which is not equipped in the filter having the critical surface tension of 46 dyne/cm does not correspond to the NYLON membrane of the filter.

The pore diameter of the membrane used for the first filter $2a$ is the nominal value of the manufacturer of the filter. In the whole embodiments shown herein, particularly in this embodiment, it is not simply said that the smaller the pore diameter is, the defect reduction effect and the effect of the storage stability characteristic as a resist solution are improved. It is preferable to select the pore diameter in consideration of the relationship between the size and the membrane material.

For example, even when filtration by only the first filter $2a$ is performed without using the second filter $4a$, or even when the first filter $2a$ is combined with the second filter $4a$ to filter, a product is used, in which the pore diameter of the membrane of the first filter $2a$ is 0.04 μm or less. If the pore diameter becomes too small, the productivity (the manufacture of the resist composition and the throughput of coating) tends to be reduced. Although the lower limit is about 0.01 μm, the lower limit is most practically set to 0.02 μm or more. The effect of the reduction of defects, particularly minute scum, microbridges and improvement of storage stability as a resist solution is acheived by the lower limit of 0.04 μm or less. The effect due to the numerical limit is exhibited by the combination with the fact that the membrane is made of NYLON as described above.

A preferable aspect in the case of combining the filtration using the second filter 4a is the same as that of the first embodiment.

In the third embodiment, a membrane which satisfies the above requirements and is not subjected to charge modification is preferable. The charge modification is the same as described in the second embodiment. That is, the membrane has zeta potential of more than −20 mV but no more than 15 mV; preferably more than −20 mV but no more than 10 mV; more preferably more than −20 mV but less than 10 mV; particularly preferably negative zeta potential (more than −20 mV). Thereby, the photoresist composition is preferably obtained in which the sensitivity and the size of the resist pattern after being filtrated are substantially unchanged even if the photoresist composition itself is filtrated. The negative zeta potential is −5 mV or less (more than −20 mV), preferably −10 to −18 mV, and more preferably −12 to −16 mV.

The reduction of defects, particularly the effect of the reduction of minute scum, microbridges and improvement of the storage stability as a resist solution is acheived by using the first filter equipped with the first membrane composed of the NYLON membrane having the pore diameter of 0.04 μm or less.

Although the reason is not clear, the present inventors speculate that the cause of the defects and foreign matter, particularly the resin with high contents of units having a polar group such as a lactone group or a hydroxyl group such as construction units (a2) and (a3) described below can be selectively absorbed into the surface of the membrane by the NYLON membrane by its specific pore diameter, whereby the filtration efficacy is improved.

[Photoresist Composition Suitable for Applying the Present Invention]

The present invention is suitable for manufacture of a chemically amplified photoresist composition essentially containing a resin component (A) and an acid-generating agent (B). That is, the method for manufacturing the present invention is suitable for treating the photoresist composition containing the components, and the filtering device and coating device of the present invention are suitable for treating the photoresist composition containing the components.

The above component (A) is not particularly limited as long as the component (A) is used for the chemically amplified photoresist composition. Examples thereof include a resin containing a construction unit derived from (meta)acrylate ester suitably used as the resin components of the photoresist composition for the ArF excimer laser.

As described above, when ArF excimer laser on wards as the light source, namely, ArF excimer lasers, $F_2$ excimer lasers, EUV, EB or the like are particularly used, minute scum and microbridges after development which do not pose large problems in the resist for the KrF excimer laser pose problems. Thereby, the present invention is preferably applied to the resist for the light source and the process and device using the light source.

Component (A)

As the component (A), an alkali soluble resin or a resin which can become alkali soluble is usually used. The former is a negative type photoresist composition, and the latter is a positive type photoresist composition.

The component (B) and a crosslinking agent are blended with the negative type photoresist composition. When an acid is generated by the component (B) due to exposure at the time of forming the resist pattern, this acid acts on the crosslinking agent, and the above component (A) is cross-linked. Thereby, the photoresist composition becomes alkali insoluble. As the crosslinking agent, for example, an amino crosslinking agent such as melamine having a methylol group or an alkoxy methyl group, urea or glycoluryl is usually used.

The positive type component (A) has an acid-dissociable dissolution inhibiting group and is alkali insoluble. When the acid is generated by the component (B) due to exposure, the acid-dissociating insoluble inhibiting group is dissociated by the acid, and thereby the above component (A) becomes alkali soluble.

Particularly, when the present invention is applied to the manufacture of a photoresist composition (particularly positive type) using a resin having a construction unit derived from (meta)acrylate ester, it is preferable that the foreign matter causing the defects and degradation of storage stability characteristic as a resist solution are effectively removed by the first filter. It is preferable that a resin having a construction unit derived from (meta)acrylate ester is 15 mol % or more. Although the upper limit is not particularly limited, the upper limit may be 100 mol %.

Although the reason is not clear, the present inventors consider that the resin tends to contain a monomer or oligomer or the like having the property removed by the first filter which causes the defects, the foreign matter or the increase of the foreign matter with the lapse of time.

Specifically, for example, the resin is preferably used for manufacture of the positive type photoresist composition using the resin containing the following construction unit (a1).

(a1): a construction unit derived from (meta)acrylate ester having an acid-dissociable dissolution inhibiting group. The resin may contain the following construction units (a2) and (a3) arbitrarily, preferably the construction units (a1) and (a2), and more preferably construction units (a1), (a2) and (a3).

(a2): a construction unit derived from (meta)acrylate ester having a lactone ring.

(a3): a construction unit derived from (meta)acrylate ester having a hydroxyl group and/or a cyano group.

Particularly, the positive type photoresist compositions for the ArF excimer laser on wards containing the above construction units (a1) and (a2) are mainly used. It is thought that various monomers, oligomers and other by-product materials cause defects or foreign matter with the lapse of time or the like in polymers obtained by polymerizing monomers having such a different polarity. The above unit (a1) has a small polarity (hydrophobicity is large), and the polarity of the above unit (a2) tends to be large.

However, the storage stability characteristic as a resist solution can be improved and the occurrence of defects can be reduced in the photoresist composition using the resin obtained by combining and polymerizing the monomers having a different polarity by applying the above first embodiment, second embodiment or third embodiment of the present invention. Particularly, since defects such as minute scum and microbridges tend to pose problems in the positive type photoresist composition for the ArF excimer laser on wards, the present invention is effectively applied therefor.

A copolymer having the construction units (a1) to (a3) or the construction units (a1) to (a4) described below is processed by the present invention. Thereby, the present inventors confirmed that a resin with high content of units having a polar group such as the construction units (a2) and (a3) is selectively trapped in the filter (particularly, one having negative zeta potential) equipped with the first membrane, and the resin is removed from the resist composition.

This resin can be synthesized by the conventional method.

Construction Unit (a1)

In the construction unit (a1), an acid dissociable dissolution inhibiting group is not particularly limited. Typically, an acid dissociable dissolution inhibiting group forming a cyclic or linear tertiary alkyl ester with a carboxyl group of (meta) acrylic acid is widely known. Of these, examples include an aliphatic monocyclic or an aliphatic polycyclic group containing an acid-dissociating dissolution inhibiting group. An aliphatic polycyclic group containing an acid dissociable dissolution inhibiting group is preferably used, which particularly excels in dry etching resistance in view of formation of the resist pattern.

Examples of the monocyclic groups include a group obtained by excluding one hydrogen atom from cyclo alkane or the like.

Examples of the aliphatic polycyclic groups include a group obtained by excluding one hydrogen atom from bicyclo alkane, tricyclo alkane, tetracyclo alkane or the like.

Specific examples include a group obtained by excluding one hydrogen atom from polycycloalkane such as cyclohexane, adamantane, norbornane, isobornane, tricyclodecane or tetracyclododecane. For example, the aliphatic polycyclic group can be selectively used from the large number of aliphatic polycyclic groups proposed, in the resin component for the resist composition for the ArF excimer laser.

Of these, the adamantyl group, the norbornyl group and the tetracyclododecanyl group are industrially preferable.

More specifically, it is preferable that the construction unit (a1) is at least one selected from the following general formulae (I), (II) and (III),

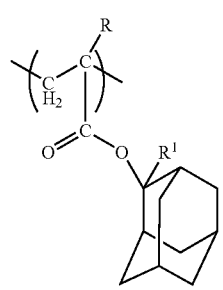

(I)

wherein R is a hydrogen atom or a methyl group, and $R^1$ is a lower alkyl group,

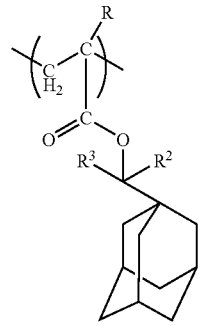

(II)

wherein R is a hydrogen atom or a methyl group, and $R^2$ and $R^3$ are independently a lower alkyl group,

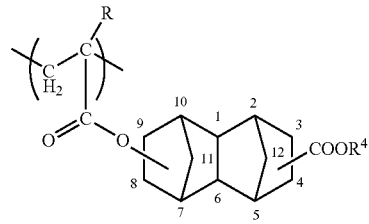

(III)

wherein R is a hydrogen atom or a methyl group, and $R^4$ is a tertiary alkyl group.

In the above formulae, $R^1$ is preferably a lower alkyl group having 1 to 5 carbon atoms and being linear or branched. Examples thereof include a methyl group, an ethyl group, a propyl group, an isopropyl group, a n-butyl group, an isobutyl group, a pentyl group, an isopentyl group and a neopentyl group. Of these, the alkyl group having carbon atoms of 2 or more, preferably having 2 to 5 carbon atoms is preferable. In this case, the alkyl group tends to have higher acid-dissociability than the methyl group. The methyl group and the ethyl group are industrially preferable.

It is preferable that $R^2$ and $R^3$ are independently lower alkyl groups having 1 to 5 carbon atoms respectively. Such a group tends to have higher acid-dissociability than the 2-methyl-2-adamantyl group.

More specifically, it is preferable that $R^2$ and $R^3$ are independently linear or branched lower alkyl group being as the above $R^1$. Of these, it is industrially preferable that both $R^2$ and $R^3$ are methyl groups, and specific examples include a construction unit derived from 2-(1-adamantyl)-2-propyl (meta)acrylate.

$R^4$ is a tertiary alkyl group such as a tert-butyl group or a tert-amyl group, and the tert-butyl group is industrially preferable.

A group —$COOR^4$ may be combined with the third or fourth position of the tetracyclo dodecanyl group shown in the formula. However, since the metamers are mixed, the connected position cannot be specified. Although the carboxyl group residue of a (meta) acrylate construction unit is also combined with the eighth or nineth position shown in the formula similarly, the connection position cannot be specified.

The construction unit (a1) is preferably one represented by the above general formula (I) or (II), and particularly preferably one represented by the above general formula (I).

The amount of the construction unit (a1) is 20 to 60 mol % relative to the sum total of all of the construction unit of the component (A), and preferably 30 to 50mol %.

Construction Unit (a2)

Examples of the construction unit (a2) include a construction unit in which a monocyclic group made of a lactone ring or an aliphatic polycyclic group having the lactone ring is combined with an ester side chain part of a (meta)acrylate ester. At this time, the lactone ring shows one ring containing an —O—C(O)— structure, and this is counted as the first ring. Therefore, herein, that including only the lactone ring is referred to as a monocyclic group, and that further including other ring structure is referred to as an aliphatic polycyclic group regardless of the structure.

Specific examples of the construction unit (a2) include a monocyclic group obtained by excluding one hydrogen atom from gamma-butyrolactone, and an aliphatic polycyclic group obtained by excluding one hydrogen atom from a lactone ring-containing polycycloalkane.

Specifically, for example, construction units represented by the following structural formulae (IV) to (VII) are preferable,

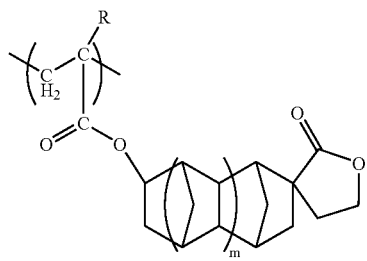

(IV)

wherein R is a hydrogen atom or a methyl group, and m is 0 or 1.

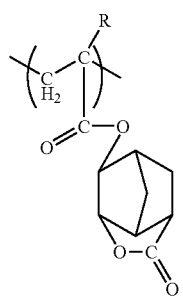

(V)

wherein R is a hydrogen atom or a methyl group.

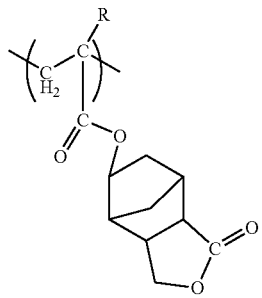

(VI)

wherein R is a hydrogen atom or a methyl group.

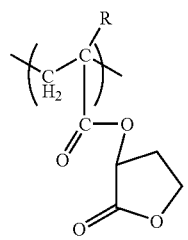

(VII)

wherein R is a hydrogen atom or a methyl group.

The amount of the construction unit (a2) is 20 to 60 mol % relative to the sum total of all of the construction units of the component (A), and preferably 20 to 50 mol %.

Construction Unit (a3)

The construction unit (a3) can be suitably and selectively used from the large number of proposed aliphatic polycyclic groups, for example, in the resin for the photoresist composition for the ArF excimer laser. For example, it is preferable that the construction unit (a3) contains a hydroxyl group and/or a cyano group-containing aliphatic polycyclic group. It is more preferable that the construction unit (a3) contains a hydroxyl group or the cyano group-containing aliphatic polycyclic group.

The aliphatic polycyclic group can be suitably selected and used from the same large number of aliphatic polycyclic groups as those illustrated in the explanation of the construction unit (a1).

Specifically, the construction unit (a3) having a hydroxyl group-containing an adamantyl group, a cyano group-containing adamantyl group or a carboxyl group-containing tetracyclododecanyl group is preferably used.

More specific examples include the construction unit represented by the following general formula (VIII),

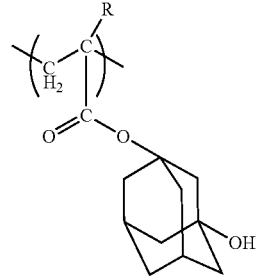

(VIII)

wherein R is a hydrogen atom or a methyl group.

The amount of the construction unit (a3) is 10 to 50 mol % relative to the sum total of all of the construction units of the component (A), and preferably 20 to 40 mol %.

The component (A) may include another construction unit (a4) other than construction units (a1) to (a3).

The construction unit (a4) is not particularly limited as long as the construction unit (a4) is another construction unit which is not classified with the above construction units (a1) to (a3).

For example, a construction unit or the like containing an aliphatic polycyclic group and derived from (meta)acrylate ester is preferable.

For example, those illustrated in the case of the above construction unit (a1) can be illustrated as the aliphatic polycyclic group, or the like, and a large number of aliphatic polycyclic groups conventionally known as those used for the resin component of the photoresist composition for the ArF excimer laser, for the KrF positive excimer laser (preferably, for the ArF excimer laser) or the like can be used.

Particularly, it is preferable that the aliphatic polycyclic group being at least one or more selected from a tricyclodecanyl group, an adamantyl group and a tetracyclododecanyl group is industrially and easily obtained.

Specific examples of the construction units (a4) include the structures of following (IX) to (XI),

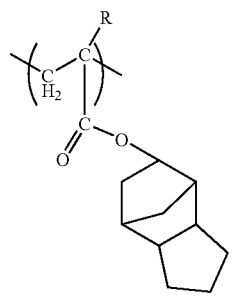

wherein R is a hydrogen atom or a methyl group,

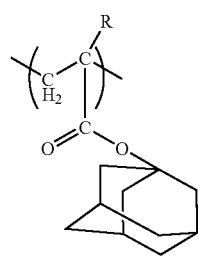

wherein R is a hydrogen atom or a methyl group,

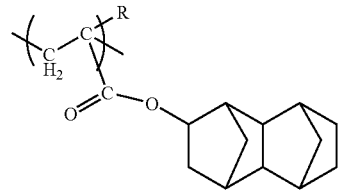

wherein R is a hydrogen atom or a methyl group.

The amount of the construction unit (a4) is preferably 1 to 25 mol % relative to the sum total of all of the construction units of the component (A), and more preferably 10 to 20 mol %.

Although the mass-average molecular weight (polystyrene equivalent, weight average molecular weight determined by gel permeation chromatography) of the resin of the component (A) is not particularly limited, the mass-average molecular weight is preferably 5000 to 30000, more preferably 8000 to 20000.

The component (A) can be constituted by a resin of one or more kinds, for example, a resin of one or more kinds having the unit derived from the above (meta) acrylic of one or more kinds may be used, and further a resin of another kind can also be mixed and used.

Component (B)

Any conventionally known acid-generating agent in the chemically amplified resist can be suitably selected and used as the component (B).

Examples include onium salts such as diphenyl iodonium trifluoromethanesulfonate, (4-methoxyphenyl)phenyl iodonium trifluoromethanesulfonate, bis(p-tert-butylphenyl)iodonium trifluoromethanesulfonate, triphenyl sulfonium trifluoromethanesulfonate, (4-methoxyphenyl)diphenyl sulfonium trifluoromethanesulfonate, (4-methylphenyl) diphenyl sulfonium nonafluorobutanesulfonate, (p-tert-butylphenyl)diphenyl sulfonium trifluoromethanesulfonate, diphenyl iodonium nonafluorobutanesulfonate, bis(p-tert-butylphenyl)iodonium nonafluorobutanesulfonate, and triphenyl sulfonium nonafluorobutanesulfonate. Of these, an onium salt which contains a fluoroalkylsulfonate ion as an anion is preferable.

The component (B) may be used singly or in combination of two or more kinds. For example, the blended amount is set to 0.5 to 30 parts by mass relative to 100 parts by mass of the component (A).

Component (C)

The component (C) is an organic solvent.

The component (C) may be used, which can dissolve the above component (A) and the above component (B) to produce a uniform solution. One or more kinds can be arbitrarily and suitably selected and used from conventionally known chemically amplified resists.

Specific examples of the component (C) include gamma-butyrolactone; ketones such as acetone, methyl ethyl ketone, cyclohexanone, methyl isoamyl ketone and 2-heptanone; polyhydric alcohols and derivatives thereof such as ethylene glycol, ethylene glycolmonoacetate, diethylene glycol, diethylene glycolmonoacetate, propylene glycol, propylene glycol monoacetate, dipropylene glycol or a mono-methyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate and ethyl ethoxypropionate. These organic solvents may be used singly or in combination of two or more kinds.

Of these, propyleneglycolmonomethyletheracetate (PGMEA) and ethyl lactate (EL) or the like are preferable. Gamma-butyrolactone may be included in the component (C) by from about 5 to about 20% by mass.

The concentration of the component (C) is set so that the photoresist composition can be applied suitably to the substrate or the like.

Other Components

Other components can be further blended with the photoresist composition if desired.

For example, so as to improve the shape of the resist pattern and post exposure stability of the latent image formed by the pattern-wise exposure of the resist layer or the like, a nitrogen-containing organic compound, for example, known amines, preferably a secondary lower aliphatic amine and a tertiary lower aliphatic amine can be contained as a component (D).

Herein, the lower aliphatic amine means an amine of alkyl or alkyl alcohol having carbon atoms of 5 or less. Examples of the second and tertiary amines include trimethylamine, diethyl amine, triethyl amine, di-n-propyl amine, tri-n-propyl amine, tripentyl amine, diethanolamine, triethanolamine. Tertiary alkanolamine such as triethanolamine is particularly preferable.

These may be used singly or in combination of two or more kinds.

The component (D) is usually used in the range of 0.01 to 5.0 parts by mass relative to 100 parts by mass of the component (A).

So as to prevent sensitivity degradation due to the addition of the above component (D) and improve the post exposure stability of the latent image formed by the pattern-wise exposure of the resist layer or the like, the organic carboxylic acid, or the oxo acid of phosphor or its derivative can be further contained as a component (E). The component (D) and the component (E) can also be used together, and any one kind thereof can also be used.

Preferable examples of the organic carboxylic acids include malonic acid, citric acid, malic acid, succinic acid, benzoic acid and salicylic acid.

Examples of the oxo acid of phosphor or its derivative include phosphoric acid or derivatives such as esters thereof, such as phosphoric acid, di-n-butyl phosphate and diphenyl phosphate; phosphonic acid and derivatives such as ester thereof, such as phosphonic acid, dimethyl phosphonate, di-n-butyl phosphonate, phenylphosphonic acid, diphenyl phosphonate and dibenzyl phosphonate; and phosphinic acid and derivatives thereof such as esters thereof, such as phosphinic acid and phenyl phosphinate. Of these, the phosphonic acid is particularly preferable.

0.01 to 5.0 parts by mass of component (E) is used per 100 parts by mass of the component (A).

The photoresist composition can further contain an additive agent having miscibility therewith if desired, for example, an additional resin for improving the performance of the resist membrane, a surface-active agent for improving coating property, a dissolution depressant, a plasticizer, a stabilizer, a colorant or a halation prevention agent or the like.

The resist pattern using the photoresist composition can be formed by the conventional method.

For example, the above photoresist composition is first coated onto a substrate such as a silicon wafer by a spinner or the like. The photoresist composition is prebaked (PAB processing) for 40 to 120 seconds, preferably for 60 to 90 seconds at 80 to 150° C. KrF, ArF, or $F_2$ excimer-laser light, Extreme UV (extreme ultraviolet radiation), an EB (electron beam) or X-ray or the like is selectively radiated, for example, by an exposure device or the like through the desired mask pattern or drawn. PEB (post exposure baking) processing is then performed at 80 to 150° C. for 40 to 120 seconds, preferably for 60 to 90 seconds. This is then developed by using an alkali developing solution, for example, tetramethyl ammonium hydroxide aqueous solution of 0.1 to 10% by mass. Thus, a resist pattern faithful to the mask pattern can be achieved.

An organic or inorganic antireflection membrane can also be provided between the substrate and the coating layer of the resist composition.

EXAMPLES

Hereinafter, the present invention will be described in detail based on the Examples.

[Evaluation Method]

Various properties of the photoresist compositions of the Examples or Comparative Examples to be described below were obtained as follows.

(1) Storage Stability Characteristic of a Resist Solution

In (Example 1-1) to (Comparative Example 1-2), the storage stability characteristic as a resist solution of the photoresist composition after storing at 40° C. after manufacture (six months, one month, or two weeks) was evaluated by using a liquid particle counter (manufactured by Rion Company, product name: KS-41).

The measuring limit was 20000 pieces/cm$^3$ or more.

The amount of foreign matter in the photoresist composition immediately after manufacture was adjusted to 10 pieces/cm$^3$ or less in terms of particles of 0.3 μm or more.

In (Example 2-1) to (Comparative Example 2-3), the storage stability characteristic as a resist solution of the photoresist composition after storing at room temperature after manufacture (one month) was evaluated using a liquid particle counter (manufactured by Rion Company, product name: KS-41).

The measuring limit was 20000 pieces/cm$^3$ or more.

The amount of the foreign matter in the photoresist composition immediately after manufacture was adjusted to 900 pieces/cm$^3$ or less in terms of particles of 0.15 μm or more.

(2) Defects

The adjusted photoresist composition (positive type) was applied on a silicon wafer (diameter of 200 mm) by using a spinner. The photoresist composition was prebaked at 130° C. for 90 seconds on a hot plate (PAB processing), and dried to form a resist layer having a membrane thickness of 350 nm.

Then, the resist layer was selectively irradiated with the ArF excimer laser (193 nm) via a mask pattern by an ArF exposure device NSR-S302 (NA (numerical aperture)=0.60, sigma=0.75, manufactured by Nikon Corporation).

The PEB processing was performed at 120° C. for 90 seconds, and puddle development was then performed at 23° C. for 60 seconds by a tetramethyl ammonium hydroxide aqueous solution of 2.38% by mass. The resist layer was then washed with water for 20 seconds, and dried to form a line-and-space pattern of 250 nm (Example 1-2 to Comparative Example 1-2). In Example 2-1 to Comparative Example 2-3, a line-and-space pattern of 130 nm was formed.

The defects were measured by a surface defect observation apparatus (KLA2132; product name), manufactured by KLA Tencor Company, and the number of defects in the wafer were evaluated. Three wafers were respectively used for the tests in the Example and Comparative Example, and the average value thereof was calculated.

In all Examples and Comparative Examples, a measuring SEM (S-9220, manufactured by Hitachi, Ltd.) confirmed that the defects were a so-called bridge type in which a bridge state was formed between line patterns.

Example 1-1

The following components (A) to (D) were mixed and dissolved to manufacture a positive type photoresist composition (for the ArF excimer laser).

Component (A): a copolymer of 100 parts by mass (mass-average molecular weight of 10000, dispersity of 1.6) obtained by copolymerizing the following monomers: 2-methyl-2-adamantyl methacrylate of 40 mol % (equivalent to the construction unit (a1)); alpha-gamma-butyrolactone methacrylate of 40 mol % (equivalent to the construction unit (a2)); and 3-hydroxy-1-adamantyl methacrylate of 20 mol % (equivalent to the construction unit (a3))

Component (B): triphenyl sulfonium nonafluorobutanesulfonate of 2.0 parts by mass Component (C): a mixed solvent of 750 parts by mass (mass ratio of 6:4) of PGMEA and EL Component (D): triethanol amine of 0.2 parts by mass A photoresist composition of 4000 ml was supplied to the first filtering part equipped with the following first filter, and the second filtering part equipped with the second filter from the storing part, and was sequentially filtered to obtain the photoresist composition. The filtration pressure of the photoresist composition supplied to the first filtering part and the second filtering part was set to 0.4 kgf/cm$^2$.

The first filter: made of NYLON, ULTIPORE N66 (product name: manufactured by Japan Pall Corporation)

The zeta potential of the first filter was −15 mV, and the pore diameter was 0.04 µm. For the specification, the filtration pressure [withstanding differential pressure (38° C.)] was 4.2 kgf/cm$^2$, and the surface area (filtration area) was 0.09 m$^2$. The filter was a disposable type, and had a diameter of 72 mm and a height of 114.5 mm. The critical surface tension was 77 dyne/cm. The second filter: made of polypropylene (product name: UNIPORE POLYFIX, manufactured by Kitz Corporation)

The pore diameter of the second filter was 0.02 µm. For the specification, the filtration pressure [withstanding differential pressure (20° C.)] was 0.4 MPa, and the surface area (filtration area) was 3400 cm$^2$. The filter was a disposable type, and had a diameter of 58 mm and a height of 148.6 mm. The critical surface tension was 29 dyne/cm.

The storage stability characteristic as a resist solution of the photoresist composition after storing at 40° C. for six months was almost unchanged as compared with that immediately after manufacture.

The average number of defects was 10 pieces or less per one wafer.

Substances adsorbed into the first filter were analyzed. The molar ratio of the above alpha-gamma-butyrolactone methacrylate unit and the above 3-hydroxy-1-adamantyl methacrylate unit among the above (a1) to (a3) was found to be more than the molar ratio of the original copolymer in the photoresist composition and to be an insoluble resin.

Example 1-2

The storage stability characteristic as a resist solution and the defects were evaluated in the same manner as in Example 1-1 by using the same filters, except that the first filter was changed to a filter of an ULTIPORE N66 (product name: manufactured by Pall Corporation) made of NYLON having pores with the pore diameter of 0.02 µm. The filtration pressure was adjusted according to the filter.

As a result, the storage stability characteristic after one month at 40° C. was almost unchanged as compared with that immediately after manufacture.

The average number of defects was 10 pieces or less per one wafer.

Example 1-3

The storage stability characteristic as a resist solution and the defects were evaluated in the same manner as in Example 1-1 by using the same first filter, and a second filter which was the same as that of Example 1-1 except that it was a filter (product name: MACRO GUARD UPE filter, manufactured by Mykrolis Corporation) having the same pore diameter as that of the second filter of Example 1-1 and made of polyethylene. The filtration pressure was adjusted according to the filter. The critical surface tension of the membrane of the second filter was 31 dyne/cm. As a result, the storage stability characteristic after one month at 40° C. was almost unchanged as compared with that immediately after manufacture. The average number of defects was 10 pieces or less per one wafer.

Example 1-4

The storage stability characteristic as a resist solution and the defects were evaluated in the same manner as in Example 1-1 by using the same first filter, except that the second filter was not used.

As a result, the storage stability characteristic as a resist solution after one month at 40° C. was almost unchanged as compared with that immediately after manufacture. The average number of defects was 10 pieces or less per one wafer. However, when the defects were similarly measured after one month at 40° C., the average number of defects was 20 to 30 pieces per one wafer.

Comparative Example 1-1

The photoresist composition was prepared in the same manner as in Example 1-1, except that the first filter was changed to the following filter, and the storage stability characteristic as a resist solution and the defects were evaluated. The first filter: made of polytetrafluoroethylene (product name: ENFLON, manufactured by Pall Corporation).

The zeta potential of the first filter was −20 mV, and the pore diameter was 0.05 µm. Referring to the specification, the filtration pressure [withstanding differential pressure (38° C.)] was 3.5 kgf/cm$^2$, and the surface area (filtration area) was 0.13 m$^2$. The critical surface tension was 28 dyne/cm. The filter was a disposable type, and had a diameter of 72 mm and a height of 114.5 mm.

As a result, the storage stability characteristic as a resist solution after two weeks at 40° C. exceeded the measuring limit, and was not able to be measured.

The average number of defects was 5000 pieces per one wafer.

The measuring SEM confirmed that the defects were a so-called bridge type in which a bridge state was formed between line patterns.

Comparative Example 1-2

The storage stability characteristic as a resist solution was evaluated in the same manner as in Example 1-1, except that a filter of N66 POSIDDYNE (product name: manufactured by Pall Corporation, zeta potential of 18 mV) made of NYLON having pores with the pore diameter of 0.1 μm was used as the first filter in Example 1-1. The filtration pressure was adjusted according to the filter.

As a result, the storage stability characteristic as a resist solution after two weeks at 40° C. exceeded the measuring limit, and was not able to be measured. It was unnecessary to measure the defects.

Example 2-1

The following components (A) to (D) were mixed and dissolved to manufacture a positive type photoresist composition (for an ArF excimer laser).
Component (A): a copolymer of 100 parts by mass (mass-average molecular weight of 11000, dispersity of 2.5) obtained by copolymerizing the following monomers:
2-methyl-2-adamantyl methacrylate of 35 mol % (equivalent to the construction unit (a1): both R and $R^1$ are a methyl group in general formula (I));
alpha-gamma-butyrolactone methacrylate of 35 mol % (equivalent to the construction unit (a2): R is a methyl group in general formula (VII));
3-hydroxy-1-adamantyl methacrylate of 15 mol % (equivalent to the construction unit (a3): R is a methyl group in general formula (VIII)); and
tricyclodecanyl methacrylate of 15 mol % (equivalent to the construction unit (a4): R is a methyl group in general formula (IX)).
Component (B): triphenyl sulfonium nonafluorobutane-sulfonate of 2.0 parts by mass
Component (C): PGMEA of 733 parts by mass (adjusted so that the solid content concentration in the composition is set to 12% by mass)
Component (D): triethanol amine of 0.2 part by mass The photoresist composition of 4000 ml was passed through the filter made of polytetrafluoroethylene used in Comparative Example 1-1, and pre-filtration for passing the photoresist composition through the same second filter as that of Example 1-1 was then performed.

The photoresist composition was then passed through an ULTIPLEAT (registered trademark: ULTIPLEAT) P-NYLON Filter (product name: manufactured by Japan Pall Corporation, zeta potential of about −12 to −16 mV, pore diameter of 0.04 μm, and critical surface tension of 77 dyne/cm) made of NYLON 66 (registered trademark) as the first filter.

The photoresist composition was evaluated.

The number of defects was 14 pieces.

Referring to the storage stability as a resist solution after storing for one month, the number of particles having a diameter of 0.15 μm or more was 982 pieces.

Substances adsorbed into the first filter were analyzed. The molar ratio of the above alpha-gamma-butyrolactone methacrylate unit and the above 3-hydroxy-1-adamantyl methacrylate unit among the above quaternary units [(a1) to (a4)] was found to be more than the molar ratio of the original copolymer in the photoresist composition and to be an insoluble resin having a mass-average molecular weight of about 40000.

Comparative Example 2-1

The photoresist composition the same as Example 2-1 was passed through the filter made of polytetrafluoroethylene used in Comparative Example 1-1 after the same pre-filtration as that of Example 2-1 to prepare the photoresist composition. The photoresist composition was evaluated in the same manner as in Example 2-1.

The number of defects was 4100 pieces.

Referring to the storage stability as a resist solution after storing for one month, the number of particles having a diameter of 0.15 μm or more was 6509 pieces.

Comparative Example 2-2

The photoresist composition the same as Example 2-1 was passed through the same pre-filtration as that of Example 2-1, thereafter, it was passed through the filter which was the same as the second filter used in Example 1-1 and was made of polypropylene to prepare the photoresist composition. The photoresist composition was evaluated in the same manner as in Example 2-1.

The number of defects was 34 pieces.

Referring to the storage stability as a resist solution after storing for one month, the number of particles having a diameter of 0.15 μm or more was 1070 pieces.

Comparative Example 2-3

A positive type photoresist composition was prepared and evaluated in the same manner as in Comparative Example 2-2, except that the pore diameter of the filter used in Comparative Example 2-2 after pre-filtration and made of polypropylene was changed to 0.05 μm from 0.02 μm. The critical surface tension was the same as that used in Comparative Example 2-2.

The number of defects was 244 pieces.

Referring to the storage stability as a resist solution after storing for one month, the number of particles having a diameter of 0.15 μm or more was 1030 pieces.

Comparative Example 2-4

The photoresist composition the same as Example 2-1 was passed through the same pre-filtration as that of Example 2-1, thereafter, it was passed through a filter (product name: MACRO GUARD UPE filter, manufactured by Mykrolis Corporation) which was the same as the second filter used in Example 1-1 except that it was made of polyethylene, and the pore diameter thereof was changed to 0.05 μm and thereby the photoresist composition was prepared. The photoresist composition was evaluated in the same manner as in Example 2-1.

The number of defects was 897 pieces.

Referring to the storage stability as a resist solution after storing for one month, the number of particles having a diameter of 0.15 μm or more was 1819 pieces.

Example 3-1

The same composition as the positive type photoresist composition of Example 2-1 was manufactured, except that salicylic acid of 0.2 parts by mass as the component (E) was added to the positive type photoresist composition of Example 2-1. The photoresist composition was then passed through the pre-filtration and the first filter in the same manner as in Example 2-1.

The photoresist composition was evaluated.

The number of defects was about 20 pieces.

Referring to the storage stability as a resist solution after storing for one month, the number of particles having a diameter of 0.20 μm or more was 7 pieces or less.

The photoresist composition was applied on a silicon wafer (diameter of 200 mm) using a spinner. The photoresist composition was prebaked on a hot plate at 130° C. for 90 seconds (PAB processing), and dried to form a resist layer having a membrane thickness of 400 nm.

Then, the resist layer was selectively irradiated with the ArF excimer laser (193 nm) via a mask pattern by an ArF exposure device NSR-S302 (NA (numerical aperture)=0.60, sigma=0.75, manufactured by Nikon Corporation).

The PEB processing was performed at 120° C. for 90 seconds, and puddle development was then performed at 23° C. for 60 seconds by a tetramethyl ammonium hydroxide aqueous solution of 2.38% by mass. The resist layer was then washed with water for 20 seconds, and dried to form a resist pattern.

The resist pattern size before filtering by using the first filter was compared with that after filtering, and the pattern size of 160 nm was not largely changed.

Comparative Example 3-1

The storage stability characteristic as a resist solution was evaluated in the same manner as in Example 3-1, except that a filter of N66 POSIDDYNE (product name: manufactured by Pall Corporation, zeta potential of 18 mV, critical surface tension of 77 dyne/cm) used in Comparative Example 1-2 and made of NYLON with pores having a pore diameter of 0.1 μm was used as the first filter in Example 3-1.

As a result, the storage stability characteristic as a resist solution after two weeks at 40° C. exceeded the measuring limit, and was not able to be measured.

It was unnecessary to measure the defects.

The resist pattern size obtained by using a resist composition after filtering by using the first filter of Comparative Example 3-1 was compared with that obtained by using a resist composition before filtering, and the pattern size of 160 nm was changed by about 15 nm.

Example 4-1

Figure 2:
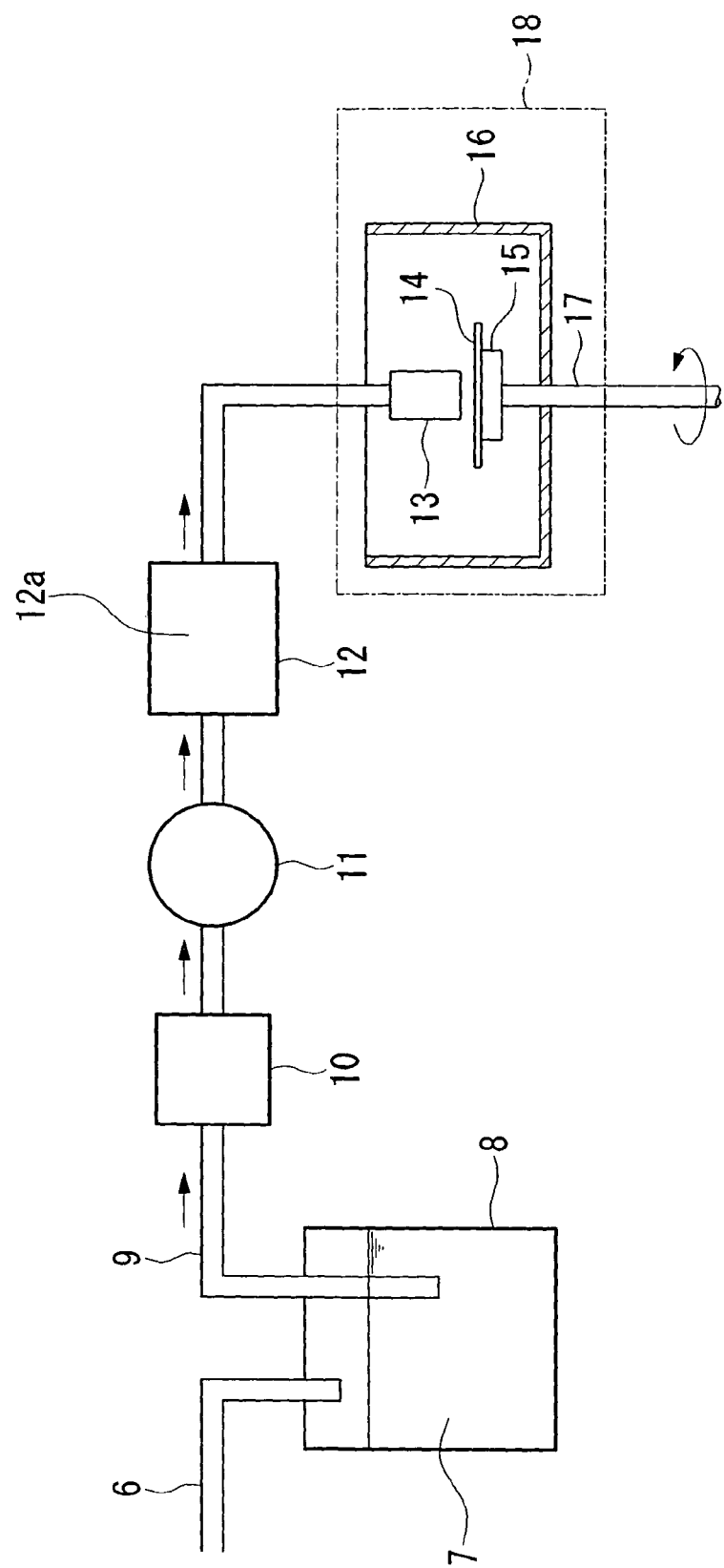
FIG. 2 is a schematic constitution diagram showing an example of a coating device equipped with the filtering device of the present invention.

FIG. 2 shows the structure of the coating device of a photoresist composition equipped with the filtering device used in Example 4-1.

In Example 4-1, the positive type photoresist composition of Example 2-1 was used.

Hereinafter, the device will be described according to the operating procedure.

A photoresist composition 7 is drawn from a reservoir tank 10 by a pump 11, and is passed through an introducing pipe 9 and a first filtering part 12. The resulting photoresist composition is supplied to a substrate 14 such as a silicon wafer from a nozzle 13 of a coating device. The composition is filtered by a first filter 12a equipped with a first membrane and provided in the first filtering part 12.

The composition after being filtered is dropped from the nozzle 13. In that case, when a rotary shaft 17 in a coating part 18 of the coating device is rotated, a supporting part 15 of the substrate 14 attached to the tip of the rotary shaft 17 rotates the substrate 14 arranged thereon. The photoresist composition dropped on the substrate 14 is spread by centrifugal force, and is applied on the substrate 14. A bottomed cylindrical body (defense wall) is provided around the nozzle 13, the substrate 14 and the supporting part 15 so that these are surrounded, and the rotary shaft 17 penetrates the bottom part. The substrate is rotated by the bottomed cylindrical body 16 to prevent the photoresist composition from scattering in all directions. A pipe 6 for pressurization is provided in a storing part 8. The photoresist composition 7 is pressurized to the reservoir tank 10 from the storing part 8 by inactive gas such as nitrogen, and thereby the photoresist composition 7 can be supplied.

The reservoir tank 10 may be provided or may not be provided. The pump 11 is not limited as long as the pump has a function for supplying the photoresist from the storing part 8 to the coating part 18.

The second filtering part equipped with the second filter can be provided at least one of before and after the first filtering part 12, and various modes for the combination of the filters can be selected as described above for the filtering device.

Although the coating device showed an example of a spinner, various methods other than a spin coating such as a slit nozzle method have been proposed in recent years for the coating methods, and devices have been also proposed. Thereby the coating device is not limited.

The coating device may be a coating-development device which can perform a subsequent development process integratedly as described above. For example, "CLEAN TRACK ACT-8" or the like manufactured by Tokyo Electron, Ltd. could be used, and it was used in this Example.

The first filtering part 12 has the first filter equipped with the first membrane having zeta potential of more than −20 mV but no more than 15 mV in distilled water of pH 7.0 in the third aspect, or the first filter equipped with the first membrane having the critical surface tension of 70 dyne/cm or more in the fourth aspect, or the first filter equipped with the first membrane composed by the NYLON membrane of 0.04 82 m or less in the eighth aspect. For example, P-NYLON or the like (product name: manufactured by Japan Pall Corporation, zeta potential of about −12 to −16 mV, pore diameter of 0.04 μm, critical surface tension of 77 dyne/cm) equipped with a membrane made of NYLON 66 (registered trademark) can be used as the filter, and it was used in this example.

According to the device, the positive type resist layer is formed on the substrate 14 by the above series of treatments using the positive type photoresist composition of Example 2-1. Afterward, in accordance with the normal lithography process, the resist pattern is formed by pre-bake, selective exposure, PEB, development and rinse. The resist pattern after being formed is measured by using the surface defect observation apparatus KLA2132 (product name) manufactured by KLA Tencor Company or the like, and the defects in the wafer are evaluated.

The second filter described in the first, second, third, fourth, seventh and eighth aspects may be used if needed.

In this Example, the lithography process was performed as follows.

The positive type photoresist composition of Example 2-1 was applied on a silicon wafer (diameter of 200 mm) using a spinner. The photoresist composition was prebaked on a hot plate at 130° C. for 90 seconds (PAB processing), and dried to form a resist layer having a membrane thickness of 350 nm.

Then, the resist layer was selectively irradiated with the ArF excimer laser (193 nm) via a mask pattern by an ArF exposure device NSR-S302 (NA (numerical aperture)=0.60, sigma=0.75, manufactured by Nikon Corporation).

The PEB processing was performed at 120° C. for 90 seconds, and puddle development was then performed at 23° C. for 60 seconds by a tetramethyl ammonium hydroxide aqueous solution of 2.38% by mass. The resist layer was then washed with water for 20 seconds, and dried to form a line-and-space pattern of 130 nm.

When the defects on the pattern were measured by the above KLA2132, the number thereof was 14 pieces, and the measurement showed very good results.

Comparative Example 4-1

The photoresist composition was prepared in the same manner as in Example 4-1, except that the first filter was changed to a filter (product name: ENFLON, manufactured by Pall Corporation) used in Comparative Example 1-1 and made of polytetrafluoroethylene, and the defects were evaluated.

As a result, when the defects on the pattern were measured, the number thereof was 4100 pieces, and the measurement showed poor results.

Comparative Example 4-2

The photoresist composition was prepared in the same manner as in Example 4-1, except that the first filter was changed to a filter (product name: UNIPORE POLYFIX, manufactured by Kitz Corporation, pore diameter of 0.02 μm) used as the second filter of Example 1-1 and made of polypropylene, and the defects were evaluated.

As a result, when the defects on the pattern were measured, the number thereof was 34 pieces, and the measurement showed poor results.

Comparative Example 4-3

The photoresist composition was prepared in the same manner as in Example 4-1, except that the first filter was changed to a filter made of polypropylene which was the same as the filter used in Comparative Example 2-3, and of which the pore diameter was 0.05 μm, and the defects were evaluated.

As a result, when the defects on the pattern were measured, the number thereof was 244 pieces, and the measurement showed poor results.

Comparative Example 4-4

The photoresist composition was prepared in the same manner as in Example 4-1, except that a filter made of polyethylene (product name: MACRO GUARD UPE filter, manufactured by Mykrolis Corporation) which was made of the same material as that of the second filter used in Example 1-3 and was most widely equipped on the coating device and of which the pore diameter was 0.05 μm was used as the first filter, and the defects were evaluated.

As a result, when the defects on the pattern were measured, the number thereof was 897 pieces, and the measurement showed poor results.

From the results of the above Examples and Comparative Examples, it is clear that the storage stability characteristic as a resist solution was remarkably improved by only changing the kind of membrane of the filter in the Examples according to the present invention.

The present inventors confirmed that minute scum and the microbridges at the time of forming the resist pattern can be also reduced remarkably. The composition characteristics before and after filtration were unchanged, and were good.

INDUSTRIAL APPLICABILITY

The present invention is effective for the method for manufacturing the photoresist composition, the filtering device, the coating device and the photoresist composition.

The invention claimed is:

1. A method for manufacturing a chemically amplified photoresist composition comprising passing a chemically amplified photoresist composition obtained by polymerizing monomers having different polarities containing a resin component (A), an acid-generating component (B) for generating an acid under exposure, and an organic solvent (C) through a first filter equipped with a first membrane having a critical surface tension of 70 dyne/cm or more, and having a negative zeta potential in distilled water of pH 7.0; and passing the chemically amplified photoresist composition through a second filter equipped with a second membrane made of polyethylene or polypropylene at least one of before or after passing the chemically amplified photoresist composition through the first filter.

2. The method for manufacturing the chemically amplified photoresist composition according to claim 1, wherein the pore diameter of at least one of the first membrane and second membrane is 0.02 μm or more and 0.1 μm or less.

3. The method for manufacturing the chemically amplified photoresist composition according to claim 1, wherein the pore diameter of the first membrane is within the range from 0.02 μm to 0.04 μm.

4. The method for manufacturing the chemically amplified photoresist composition according to claim 3, wherein the pore diameter of the first membrane is 0.04 μm.

5. The method for manufacturing the chemically amplified photoresist composition according to claim 1, wherein the component (A) is a resin having a construction unit derived from a (meth)acrylate ester.

6. The method for manufacturing the chemically amplified photoresist composition according to claim 5, wherein the component (A) has a construction unit (a1) derived from a (meth)acrylate ester having an acid-dissociable dissolution inhibiting group, and a construction unit (a2) derived from a (meth)acrylate ester having a lactone ring.

7. The method for manufacturing the chemically amplified photoresist composition according to claim 6, wherein the component (A) has a construction unit (a1) derived from a (meth)acrylate ester having an acid-dissociable dissolution inhibiting group, a construction unit (a2) derived from a (meth)acrylate ester having a lactone ring, and a construction unit (a3) derived from a (meth)acrylate ester having a hydroxyl group and/or a cyano group.

8. The method for manufacturing the chemically amplified photoresist composition according to claim 7, wherein the component (A) has a construction unit (a1) derived from a (meth)acrylate ester having an acid-dissociable dissolution inhibiting group, a construction unit (a2) derived from a (meth)acrylate ester having a lactone ring, a construction unit (a3) derived from a (meta)acrylate ester having a hydroxyl group and/or a cyano group, and a construction unit (a4)

which is different from the construction units (a1) to (a3) and is derived from an aliphatic polycyclic group-containing (meth)acrylate ester.

9. A method for manufacturing a chemically amplified photoresist composition comprising passing a chemically amplified photoresist composition containing a resin component obtained by polymerizing monomers having different polarities (A), an acid-generating component (B) for generating an acid under exposure, and an organic solvent (C) through a first filter equipped with a first membrane; and passing the chemically amplified photoresist composition through a second filter equipped with a second membrane made of polyethylene or polypropylene at least one of before or after passing the chemically amplified photoresist composition through the first filter, wherein the component (A) has a construction unit (a1) derived from a (meth)acrylate ester having an acid-dissociable dissolution inhibiting group, a construction unit (a2) derived from a (meth)acrylate ester having a lactone ring, a construction unit (a3) derived from a (meth)acrylate ester having a hydroxyl group and/or a cyano group, and a construction unit (a4) derived from at least one of aliphatic polycyclic group-containing (meth)acrylate esters represented by general formulae (IX) to (XI) shown below:

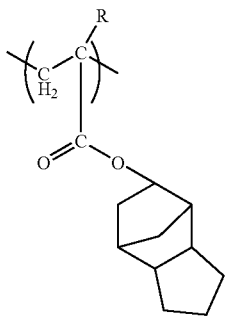

(IX)

wherein R is a hydrogen atom or a methyl group,

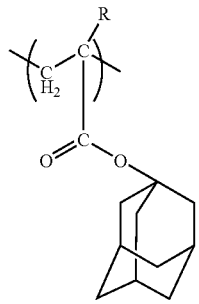

(X)

wherein R is a hydrogen atom or a methyl group,

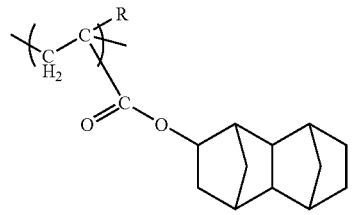

(XI)

wherein R is a hydrogen atom or a methyl group, and wherein a filter equipped with a membrane having a pore diameter of 0.04 μm or less and made of a NYLON membrane is used as the first filter.

10. A method for manufacturing a chemically amplified photoresist composition according to any one of claims 5 to 8, wherein the quantity of the construction unit derived from a (meth)acrylate ester is 15 mol % or more.

11. A method for manufacturing a chemically amplified photoresist composition according to claim 1, wherein a filter equipped with a first membrane having a pore diameter of 0.04 μm or less and made of a NYLON membrane is used as the first filter.

* * * * *